United States Patent
Ahn

(10) Patent No.: US 7,116,167 B2
(45) Date of Patent: Oct. 3, 2006

(54) PREDISTORTION LINEARIZER AND METHOD THEREOF

(75) Inventor: Kwang-Eun Ahn, Suwon-shi (KR)

(73) Assignee: LG Electronics Inc., Seoul (KR)

( * ) Notice: Subject to any disclaimer, the term of this patent is extended or adjusted under 35 U.S.C. 154(b) by 802 days.

(21) Appl. No.: 09/908,551

(22) Filed: Jul. 20, 2001

(65) Prior Publication Data

US 2002/0012404 A1   Jan. 31, 2002

(30) Foreign Application Priority Data

Jul. 20, 2000 (KR) ............................... 2000-41618

(51) Int. Cl.
   *H03F 1/00*   (2006.01)
(52) U.S. Cl. .................. 330/151; 330/149; 330/52; 330/2; 330/124; 375/297; 375/296; 341/118; 455/63.1
(58) Field of Classification Search ............ 375/297, 375/296; 330/151, 149, 52, 2; 341/118; 455/63.1
See application file for complete search history.

(56) References Cited

U.S. PATENT DOCUMENTS

| | | | |
|---|---|---|---|
| 5,760,646 A * | 6/1998 | Belcher et al. ............. 330/149 |
| 5,789,976 A * | 8/1998 | Ghannouchi et al. ......... 330/52 |
| 5,959,500 A * | 9/1999 | Garrido ....................... 330/151 |
| 6,236,837 B1 * | 5/2001 | Midya ........................ 455/63.1 |
| 6,396,344 B1 * | 5/2002 | Gentzler et al. ............ 330/149 |
| 6,414,546 B1 * | 7/2002 | Cavers ........................ 330/149 |
| 6,459,334 B1 * | 10/2002 | Wright et al. .................. 330/2 |
| 6,522,198 B1 * | 2/2003 | Ahn ........................... 330/149 |
| 6,583,739 B1 * | 6/2003 | Kenington ................... 341/118 |
| 6,831,512 B1 * | 12/2004 | Cavers et al. ............... 330/149 |
| 2002/0080891 A1 * | 6/2002 | Ahn et al. ................... 375/297 |

* cited by examiner

*Primary Examiner*—Emmanuel Bayard
*Assistant Examiner*—Sudhanshu C. Pathak
(74) *Attorney, Agent, or Firm*—Fleshner & Kim, LLP

(57) ABSTRACT

A predistortion linearizer may include a digital signal processor (DSP) for modeling a nonlinear characteristic of a high power amplifier (HPA) on a real time basis; a distortion signal generator for generating a distortion signal by using the signal modeled by the DSP; and a main path unit for combining the output signal of the HPA and the distortion signal of the distortion signal generator and transmitting an input signal without a distortion component. Since the nonlinear characteristic of the power amplifier is modeled on a real time basis to remove the distortion component contained in the output signal of the power amplifier, the nonlinear characteristic of the power amplifier is improved, and thus, an efficiency of the power amplifier can be maximized.

21 Claims, 2 Drawing Sheets

PREDISTORTION LINEARIZER AND METHOD THEREOF

BACKGROUND OF THE INVENTION

1. Field of the Invention

The present invention relates to a power amplifier, and more particularly, to a predistortion linearizer that is capable of improving a nonlinear characteristic, and its method.

2. Description of the Background Art

Generally, a power amplifier is used to increase power of a radio frequency (RF). An ideal power amplifier would increase only the magnitude without distorting an input RF signal.

However, since the power amplifier typically includes an active device having a nonlinear characteristic, an output of the power amplifier inevitably includes a distortion component. Thus, in order to improve the nonlinear characteristic of the power amplifier, various linearization techniques and algorithms are proposed. Typical linearization methods include a predistortion method, an envelope feedback method and a feedforward method or the like.

FIG. 1 shows the construction of a linearizer of a power amplifier adopting the feedforward method in a base station transmitting apparatus in accordance with a conventional art.

As shown in FIG. 1, a linearizer of a conventional power amplifier includes a main path unit 100 and a distortion signal detecting unit 200.

The main path unit 100 includes a modem 110 for generating a source signal; an analog baseband unit 120 for converting the generated source signal to a baseband analog signal; an up converter 130 for up-converting the converted analog signal; a gain and phase controller 140 for controlling a gain and a phase of the up-converted signal; a high power amplifier (HPA) 150 for amplifying the output signal of the gain and phase controller 140; a delay unit 160 for delaying the output signal of the HPA 150; a combiner 170 for combining the output signal of the delay unit 160 and the distortion signal generated from the distortion signal detecting unit 200 and removing a distortion component contained in the output signal of the HPA 150; a filter 180 for filtering the output signal of the combiner 170; and a transmission unit 190 for transmitting the filtered signal.

The distortion signal detecting unit 200 includes a delay unit 210 for delaying the output signal of the up-converter 130; a combiner 220 for combining the output signals of the delay unit 210 and the HPA 150 and detecting a distortion component contained in the output signal of the HPA 150; a gain and phase controller 230 for controlling a gain and a phase of the distortion signal detected by the combiner 220; and a distortion amplifier 240 for amplifying the output signal of the gain and phase controller 230 and outputting it to the combiner 170 of the main path unit 100.

The operation of the linearizer of the power amplifier adopting the feedforward method of the conventional art will now be described with reference to FIG. 1.

The source signal generated by the modem 110 is converted into a baseband analog signal by the analog baseband unit 120 and then converted into a radio frequency signal 130a. The converted radio frequency signal 130a is gain and phase-controlled by the gain and phase controller 140 and amplified to a predetermined level by the HPA 150.

At this time, the combiner 220 of the distortion signal detector 200 combines the output signals 130a and 150a of the up-converter 130 and the HPA150 which have been delayed by the delay unit 210, detects a distortion signal 220a contained in the output signal 150a of the HPA 150, and inputs the detected distortion signal 220a through the gain and phase controller 230 and the distortion amplifier 240 to the combiner 170 of the main path unit 100.

The combiner 170 combines the output signal 150a of the HPA 240 which has been delayed by the delay unit 150 and the distortion signal 220a amplified by the distortion amplifier 240, and outputs only an input signal 130b without the distortion component.

A spurious component of the output signal 130b of the combiner 170 is removed by the filter 180 and then the output signal without the spurious component is transmitted through the transmission unit 190.

However, as for the linearizer of the conventional power amplifier, if the input signal provided as an input of the power amplifier is distorted, an output signal of the power amplifier inevitably contains a distortion component no matter how excellent the performance of the power amplifier is.

Thus, in the linearizer of the conventional power amplifier, when the up-converter performs a frequency up converting, an output signal of the up-converter may contain the distortion component, which becomes an obstacle to improvement of the nonlinear characteristic of the power amplifier.

In order to improve the nonlinear characteristic of the conventional power amplifier, the final output of the power amplifier is lowly backed off so that the power amplifier can be linearly operated for the whole change interval of an input signal. In such a case, however, an efficiency of the power amplifier is much degraded.

In addition, the linearizer adopting the feedforward method exhibits a low efficiency compared to other linearization methods.

SUMMARY OF THE INVENTION

Therefore, an object of the present invention is to provide a predistortion linearizer that is capable of improving a nonlinear characteristic of a power amplifier, and its method.

To achieve these and other advantages and in accordance with the purpose of the present invention, as embodied and broadly described herein, there is provided a predistortion linearizer including: a digital signal processor (DSP) for modeling a nonlinear characteristic of a high power amplifier (HPA) on a real time basis; a distortion signal generator for generating a distortion signal by using the signal modeled by the DSP; and a main path unit for combining the output signal of the HPA and the distortion signal outputted from an error generator and transmitting an input signal without a distortion component.

To achieve the above objects, there is further provided a predistortion linearizing method including the steps of: converting a first input signal so as to have the opposite characteristic to that of the power amplifier; amplifying the converted second input signal by a power amplifier; modeling a nonlinear characteristic of the power amplifier by using the second input signal and the output signal of the power amplifier; operating the first input signal and the modeled signal and generating a distortion signal; and combining the output signal of the power amplifier and the distortion signal and transmitting a radio frequency signal without a distortion component.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
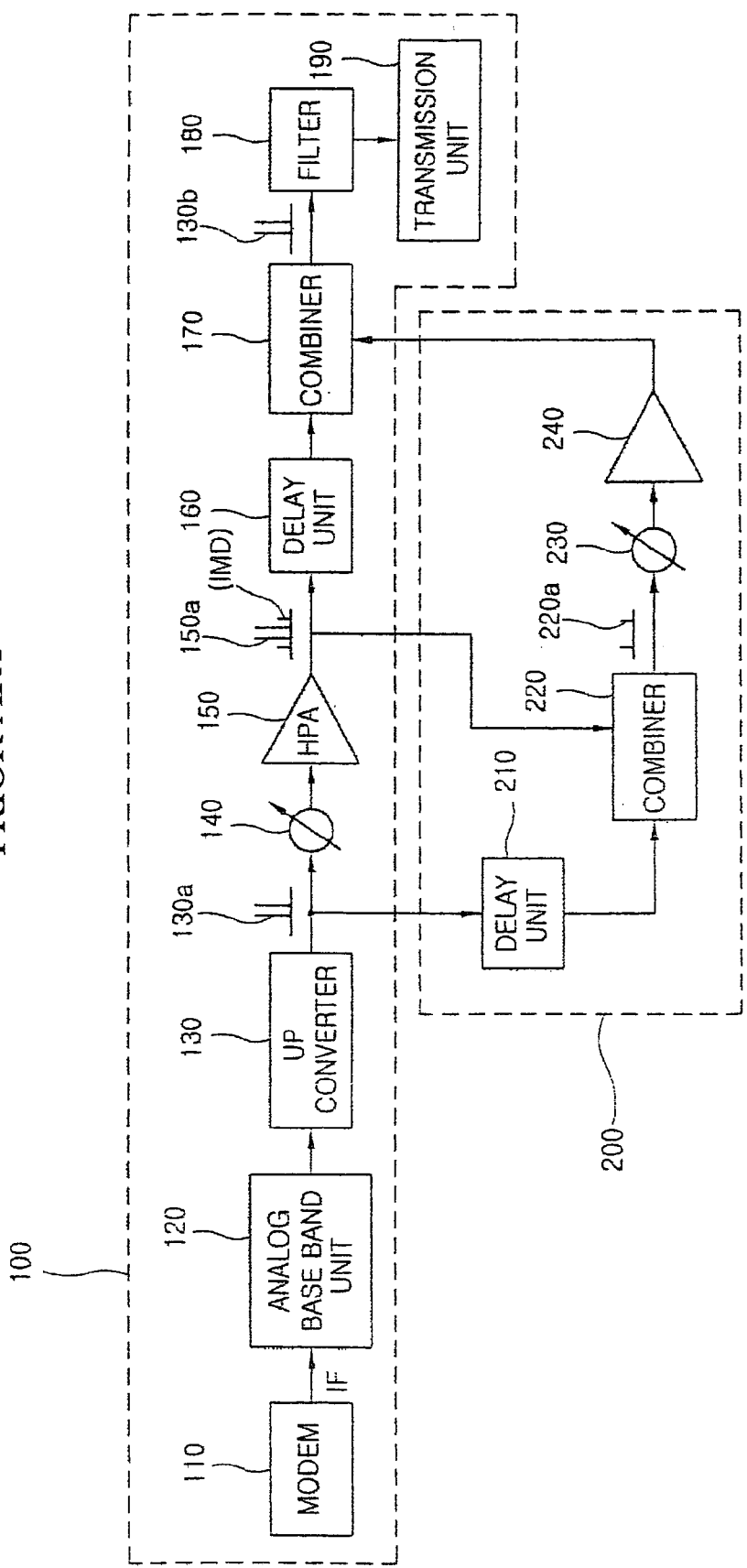
FIG. 1 is a linearizer of a power amplifier adopting the feedforward method in accordance with a conventional art.
Figure 2:
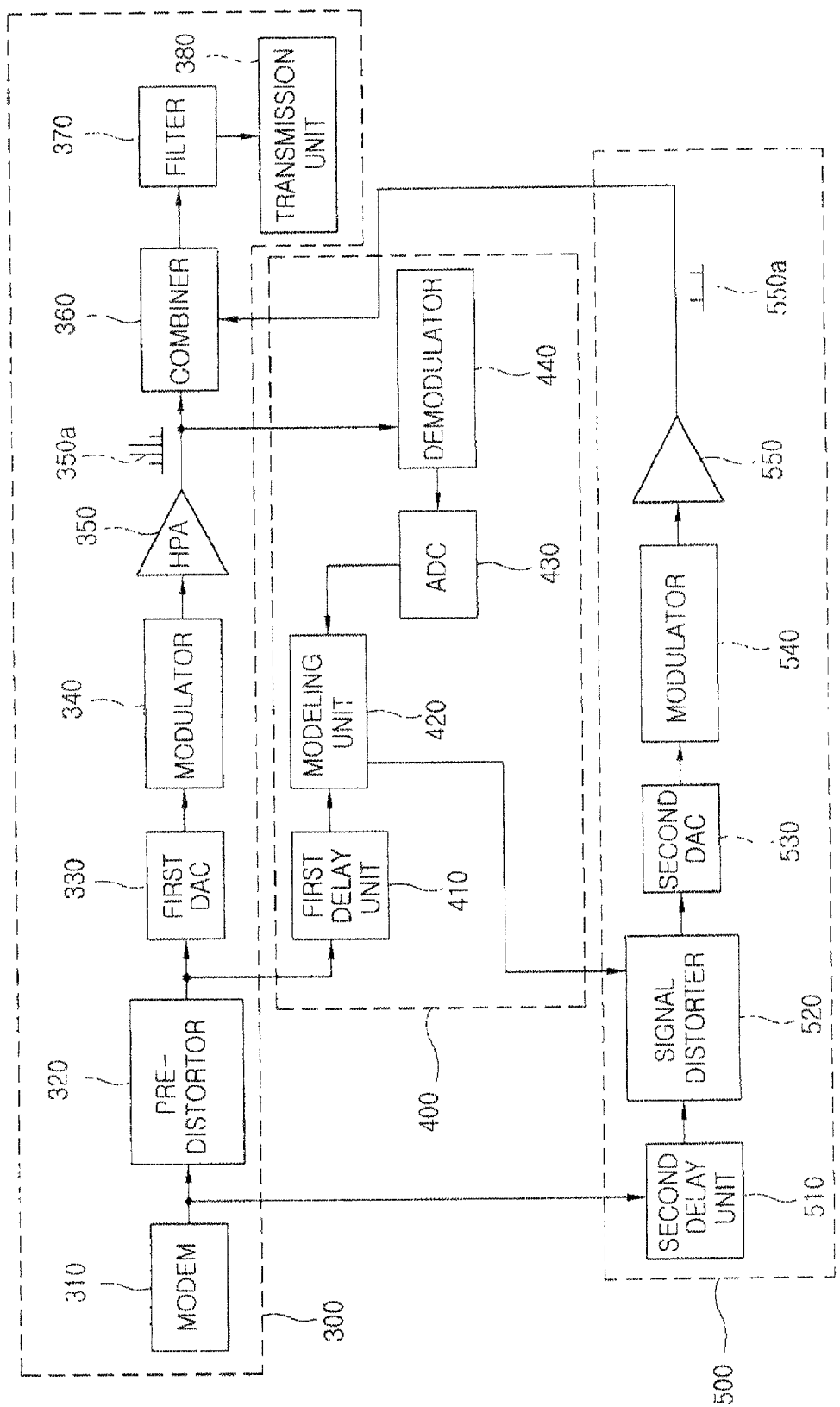
FIG. 2 is a predistortion linearizer of a power amplifier in accordance with a preferred embodiment of the present invention.

FIG. 2 is a predistortion linearizer of a power amplifier in accordance with a preferred embodiment of the present invention.

As shown in FIG. 2, a predistortion linearizer of a power amplifier in accordance with a preferred embodiment of the present invention includes: a main path unit 300 for amplifying a source signal to a predetermined level by a power amplifier, removing a distortion component from the amplified signal and transmitting the resulting signal without the distortion component; a digital signal processor (DSP) 400 for modeling the nonlinear characteristic of the power amplifier on a real time basis; and a distortion signal generator 500 for detecting a distortion signal contained in the output signal of the power amplifier and outputting the distortion signal to the main path unit 300.

The main path unit 300 includes a modem 310 for generating source signals I and Q; a predistorter 320 for converting a gain and a phase of the source signal to be the opposite to the output characteristic of the HPA 350; a first digital/analog converter (DAC) 330 for converting the output signal of the predistorter 320 to an analog signal; the modulator 340 for converting the output signal of the first DAC 330 to a radio frequency signal; an HPA 350 for amplifying the radio signal outputted from the modulator 340; a combiner 360 for combining the output signal 350a of the HPA 350 and the distortion signal 550a generated from the distortion signal generator 500; a filter 370 for filtering the output signal of the combiner 360; and a transmission unit 380 for transmitting the filtered signal.

The DSP 400 includes a delay unit 410 for delaying the output signal of the predistorter 320; a demodulator 440 for demodulating the output signal 350a of the HPA 350 to an intermediate frequency signal; an analog/digital converter (ADC) 430 for converting the demodulated signal to a digital signal; and a signal modeling unit 420 for modeling a nonlinear characteristic of the HPA 350 on a real time basis by using the output signals of the ADC 430 and the delay unit 410.

The distortion signal generator 500 includes a delay unit 510 for delaying a source signal; a signal distorter 520 for generating a distortion signal by using the output signals of the delay unit 510 and the DSP 400; a second DAC 350 for converting the output signal of the signal distorter 520 to an analog signal; a modulator 540 for modulating the converted analog signal to a radio frequency signal; and an error amplifier 550 for amplifying the modulated signal and outputting it to the main path unit 300.

The operation of the predistortion linearizer in accordance with the preferred embodiment of the present invention constructed as described above will now be explained.

The modem 310 generates an input signal (a source signal), and the predistorter 320 changes a gain and a phase of the input signal so as to have the opposite characteristic to that of the power amplifier.

The gain and phase-converted input signal is converted to an analog signal by the DAC 330, and modulated to a radio frequency signal by the modulator 340. And then, the HPA 350 amplifies the modulated radio frequency signal to a predetermined level and outputs it.

The gain (size) and the phase of the HPA varies, not being constant, according to an input signal. That is, according to the magnitude of the input signal, the gain and the phase of the output signal of the HPA 350 is nonlinearly outputted, which is called AM-AM and AM-PM distortions.

Accordingly, due to the AM-AM and AM-PM distortions, the output of the power amplifier contains a distortion component besides the input signal, which is generally called an inter-modulation distortion (IMD).

The IMD according to the AM-AM and AM-PM distortion causes a spectral regrowth in a digital communication system, resulting in a performance degradation of the communication system.

Assuming that the input signal (source signal) is defined 'X', the output signal (HPAS) 350a of the HPA 350 contains a third and a fifth component distortion signals (IMD) besides the input signal (X) as expressed in below equation (1):

$$HPAS = X + pX^3 + qX^5 \quad (1)$$

Wherein 'p' and 'q' are unknown coefficients.

At this time, the signal modeling unit 420 of the DSP 500 models the nonlinear characteristic of the HPA 350 by using the output signal of the predistorter 320 which has been delayed by the delay unit 410 and the digital signal outputted from the ADC 430, and outputs a modeled signal (M) as expressed in below equation (2):

$$M = 1 + pX^2 + qX^4 \quad (2)$$

Accordingly, the signal modeling unit 420 can model the nonlinear characteristic of the HPA 350 by determining the unknown coefficients 'p' and 'q'. The unknown coefficients are determined by comparing a result obtained by multiplying the equation (2) of the HPA 350 by the input signal (X) and the actual output signal 350a of the HPA 350 and minimizing the two values The signal distorter 520 of the distortion signal generator 500 operates the input signal (X) delayed by the delay unit 510 and the modeled signal (M) generated by the signal modeling unit 420 and generates a distortion signal.

That is, as expressed in below equations (3) and (4), the signal distorter 520 multiplies the input signal (X) and the modeled signal (M) together and subtracts the input signal (X) from the multiplied signal, to generate a distortion signal.

When a distortion signal is generated, the DAC 530 converts the distortion signal outputted from the signal distorter 520 to an analog distortion signal, and the modulator 540 modulates the converted analog distortion signal to a radio frequency signal, and then, the error amplifier 550 amplifies the analog distortion signal to the combiner 360 of the main path unit 300.

Accordingly, the combiner 360 removes the distortion signal amplified by the error amplifier 550 from the output signal 350a of the HPA 350 and outputs the original input signal (X) which has been changed only in its magnitude.

$$(1)-(4)=(X+pX^3+qX^5)-(pX^3+qX_5)=X$$

Thereafter, the output signal of the combiner 360 is filtered by the filter 370 and transmitted through the transmission unit 380.

As so far described, according to the predistortion linearizer of a power amplifier of the present invention, since the nonlinear characteristic of the power amplifier is modeled on a real time basis to remove the distortion component contained in the output signal of the power amplifier, the nonlinear characteristic of the power amplifier is improved, and thus, an efficiency of the power amplifier can be maximized.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A predistortion linearizer comprising:
   a digital signal processor (DSP) for modeling a nonlinear characteristic of a high power amplifier (HPA) on a real time basis, the DSP receiving an output signal of the HPA and an output signal of a predistorter, the DSP outputting a signal modeled by the DSP;
   a distortion signal generator for generating a distortion signal by using the signal modeled by the DSP; and
   a main path unit for combining the output signal of the HPA and the distortion signal of the distortion signal generator and transmitting a signal without a distortion component, the main path unit including the predistorter to receive an input signal, the HPA and a combiner, the combiner combining the output signal of the HPA and the distortion signal of the distortion signal generator.

2. The linearizer of claim 1, wherein the main path unit comprises:
   the predistorter for converting a gain and a phase of the input signal so that the input signal has the opposite characteristic to that of the HPA;
   a digital/analog converter (DAC) for converting the output signal of the predistorter to an analog signal;
   a modulator for modulating the output signal of the DAC to a radio frequency signal;
   the HPA for amplifying the radio frequency signal outputted from the modulator;
   the combiner for combining the output signal of the HPA and the distortion signal;
   a filter for filtering the output signal of the combiner; and
   a transmission unit for transmitting the filtered signal.

3. The linearizer of claim 1, wherein the DSP comprises:
   a first delay unit for delaying the output signal of the predistorter;
   a demodulator for demodulating the output signal of the HPA to an intermediate frequency signal;
   an analog/digital converter (ADC) for converting the demodulated signal to a digital signal; and
   a signal modeling unit for modeling the nonlinear characteristic of the HPA on a real time basis by using the output signals of the ADC and the first delay unit.

4. The linearizer of claim 1, wherein the distortion signal generator comprises:
   a delay unit for delaying the input signal;
   a signal distorter for generating the distortion signal by using the output signals of the delay unit and the DSP;
   a DAC for converting the output signal of the signal distorter to an analog signal;
   a modulator for modulating the converted analog signal to a radio frequency signal; and
   an error amplifier for amplifying the modulated signal and outputting it to the main path unit.

5. The linearizer of claim 4, wherein the signal distorter multiplies a modeled signal outputted from the signal modeling unit and the output signal of the delay unit together, subtracts the output signal of the delay unit from the multiplied signal, to generate the distortion signal.

6. A predistortion linearizing method comprising:
   converting a first input signal so as to have the opposite characteristic to that of a power amplifier;
   delaying the first input signal to become a delayed first input signal;
   amplifying the converted first input signal by a power amplifier;
   modeling a nonlinear characteristic of the power amplifier to produce a modeled signal by using a second input signal and the output signal of the power amplifier;
   generating a distortion signal based on the delayed first input signal and the modeled signal; and
   combining the output signal of the power amplifier and the distortion signal and transmitting a radio frequency signal without a distortion component.

7. The method of claim 6, wherein converting the first input signal includes passing the first input signal through a predistorter.

8. The method of claim 7, wherein converting the first input signal further includes converting a gain and a phase of the first input signal to be opposite the output characteristic of the power amplifier.

9. The method of claim 6, further comprising:
   converting an output signal of the predistorter to an analog signal; and
   converting the analog signal to a radio frequency signal before the amplifying by the power amplifier.

10. The method of claim 6, wherein modeling the nonlinear characteristic is performed in real-time.

11. A predistortion linearizer comprising:
    a main path unit including a predistorter, a digital/analog converter, a modulator, an amplifier, a combiner and a transmitter;
    a digital signal processor coupled to the main path unit to provide a modeling signal indicative of a characteristic of the amplifier based on an output signal of the predistorter and an output signal of the amplifier; and
    a distortion signal generator to generate a distortion signal based on the modeling signal, wherein the combiner combines the output signal of the amplifier and the distortion signal of the distortion signal generator prior to transmission by the transmitter; wherein the digital signal processor comprises:
    a first delay unit to delay the output signal of the predistorter, a demodulator to demodulate an output signal of the amplifier to an intermediate frequency signal, an analog/digital converter to convert the demodulated signal to a digital signal, and a signal modeling unit to model a non-linear characteristic of the amplifier on a real time basis by using the output signals of the analog/digital converter and the first delay unit.

12. The predistortion linearizer of claim 11, wherein the digital signal processor models the non-linear characteristic of the amplifier on a real time basis in order to provide the modeling signal.

13. The predistortion linearizer of claim 11, wherein the transmitter transmits the output signal without a distortion component.

14. The predistortion linearizer of claim 11, wherein the main path unit comprises:

the predistorter for converting a gain and a phase of an input signal so that the output signal of the predistorter has an opposite characteristic as the amplifier;

the digital/analog converter to convert the output signal of the predistorter to an analog signal;

the modulator to modulate the output signal of the digital/analog converter to a radio frequency signal;

the amplifier to amplify the radio frequency signal output from the modulator;

the combiner to combine the output signal of the amplifier and the distortion signal;

a filter for filtering an output signal of the combiner; and the transmitter to transmit the filtered signal.

15. The predistortion linearizer of claim 11, wherein the digital signal processor comprises:

a first delay unit to delay the output signal of the predistorter;

a demodulator to demodulate an output signal of the amplifier to an intermediate frequency signal;

an analog/digital converter to convert the demodulated signal to a digital signal; and a signal modeling unit to model a nonlinear characteristic of the amplifier on a real time basis by using the output signals of the analog/digital converter and the first delay unit.

16. The predistortion linearizer of claim 11, wherein the distortion signal generator comprises:

a delay unit to delay an input signal;

a signal distorter to generate the distortion signal based on the output signals of the delay unit and the digital signal processor;

a digital/analog converter to convert an output signal of the signal distorter to an analog signal;

a modulator to modulate the converted analog signal to a radio frequency signal; and an error amplifier to amplify the modulated signal and output the amplified modulated signal to the main path unit.

17. The predistortion linearizer of claim 16, wherein the signal distorter multiplies the modeling signal output from the digital signal processor and the output signal of the delay unit together, subtracts the output signal of the delay unit from the multiplied signal, to generate the distortion signal.

18. The linearizer of claim 1, wherein the predistorter converts a gain and a phase of the input signal.

19. The linearizer of claim 1, wherein the distortion signal generator generates the distortion signal by:

combining a modeled signal from the digital signal processor and a delayed input signal; and subtracting the delayed input signal from the combined signal.

20. A predistortion linearizer comprising:

a main path unit including a predistorter, a digital/analog converter, a modulator, an amplifier, a combiner and a transmitter;

a digital signal processor to provide a modeling signal indicative of a characteristic of the amplifier based on an output signal of the predistorter and an output signal of the amplifier; and a distortion signal generator to generate a distortion signal based on the modeling signal, the combiner to combine the output signal of the amplifier and the distortion signal of the distortion signal generator prior to transmission by the transmitter, wherein the distortion signal generator includes:

a delay unit to delay an input signal, a signal distorter to generate the distortion signal based on the modeling signal of the digital signal processor and an output signal of the delay unit, a digital/analog converter to convert an output signal of the signal distorter to an analog signal, a modulator to modulate the converted analog signal to a radio frequency signal, and an error amplifier to amplify the modulated signal and output the amplified modulated signal to the main path unit.

21. The predistortion linearizer of claim 20, wherein the signal distorter generates the distortion signal by multiplying the modeling signal from the digital signal processor and the output signal of the delay unit to obtain a multiplied signal and by subtracting the output signal of the delay unit from the multiplied signal.

* * * * *